United States Patent
Hirsch et al.

(10) Patent No.: US 7,759,901 B2
(45) Date of Patent: Jul. 20, 2010

(54) BATTERY MONITORING SYSTEM

(75) Inventors: Krystian Hirsch, Wuelfrath (DE);
Volker Heise, Trier (DE); Peter Baur,
Trier (DE)

(73) Assignee: Delphi Technologies, Inc., Troy, MI (US)

( * ) Notice: Subject to any disclaimer, the term of this patent is extended or adjusted under 35 U.S.C. 154(b) by 358 days.

(21) Appl. No.: 11/895,034

(22) Filed: Aug. 22, 2007

(65) Prior Publication Data

US 2008/0048662 A1 Feb. 28, 2008

(30) Foreign Application Priority Data

Aug. 22, 2006 (EP) .................................. 06017466

(51) Int. Cl.
*H02J 7/00* (2006.01)
(52) U.S. Cl. ........................ 320/129; 320/132; 320/136; 324/427
(58) Field of Classification Search ................. 324/427, 324/430; 320/129, 132, 134, 136, 139, 162
See application file for complete search history.

(56) References Cited

U.S. PATENT DOCUMENTS

| | | | |
|---|---|---|---|
| 4,678,998 A | 7/1987 | Muramatsu | |
| 6,002,238 A | 12/1999 | Champlin | |
| 2005/0154544 A1* | 7/2005 | Ono | 702/63 |
| 2006/0170397 A1 | 8/2006 | Srinivasan et al. | |

FOREIGN PATENT DOCUMENTS

EP 1632782 2/2004

* cited by examiner

*Primary Examiner*—Edward Tso
*Assistant Examiner*—Aaron Piggush
(74) *Attorney, Agent, or Firm*—Thomas N. Twomey

(57) ABSTRACT

A system for the monitoring of the state of a battery used in a vehicle and to which electrical elements comprising at least one electrical consumer and/or at least one electrical generator are connected comprises means for the detection of the battery voltage, means for the extraction of voltage frequency components from the detected battery voltage at different frequencies, means for the detection of the current flowing out of or into the battery, means for the extraction of current frequency components from the detected battery current at the same frequencies at which the voltage frequency components were extracted, means for the determination of internal impedances of the battery from the voltage frequency components and current frequency components extracted at a respective frequency, means for the storage of predetermined relationships between the internal impedance and the battery state for each of the respective frequencies and means for the determination of the battery state from the determined internal impedances and the predetermined relationships. In this connection, means are provided for the monitoring of the state of at least some of the electrical elements as well as means in order to select the time for a respective voltage and current detection in dependence on the detected state of the electrical elements and/or to fix the conditions for a respective voltage and current detection.

7 Claims, 3 Drawing Sheets

BATTERY MONITORING SYSTEM

TECHNICAL FIELD

The invention relates to a system for the monitoring of the state of a battery used in a vehicle and to which electrical elements comprising at least one electrical consumer and/or at least one electrical generator are connected, having means for the detection of the battery voltage, means for the extraction of voltage frequency components from the detected battery voltage at different frequencies, means for the detection of the current flowing out of or into the battery, means for the extraction of current frequency components from the detected battery current at the same frequencies at which the voltage frequency components were extracted, means for the determination of internal impedances of the battery from the voltage frequency components and current frequency components extracted at a respective frequency, means for the storage of predetermined relationships between the internal impedance and the battery state for each of the respective frequencies and means for the determination of the battery state from the determined internal impedances and the predetermined relationships. The vehicles can in particular be motor vehicles.

BACKGROUND OF THE INVENTION

In modern vehicles, the battery is of essential importance as an energy store not only for the operation of the vehicle, such as starting, but increasingly also as a store for regained energy, such as for brake energy storage.

To ensure the operational security required for this, there must be the possibility of being able to determine the internal states of the battery. They can normally be determined by factors such as the following:

Current charge state (SoC), aging state (SoH) and, for special main functions, degree of function satisfaction (SoF).

Previously known systems for the determination of the battery state include sensors which use measured current values, voltage values and temperature values as the input values for an internally simulated battery model. A disadvantage of these battery models consists of the fact that they are relatively inexact, which is due to the complexity of these models in particular in connection with the generally used lead acid batteries and to the limited means for the calculation which are made available by the integrated system including the respective models. The respectively required compromise between the required complexity and the system costs frequently takes place at the cost of the achievable performance.

In EP 1 632 782 A1 so-called impedance spectroscopy is described as the method for the determination of the battery states which is based on an analysis of the spectrum of the internal impedance of the battery to be inspected. This requires a specific test by means of a frequency sweep excitation for the obtaining of the impedance profile, whereby the use of this method was previously restricted to a stationary test device.

A monitoring system of the initially named kind is known from U.S. Pat. No. 4,678,998. In this known system, the required different frequency components in the battery current are generated by electrical consumers of the respective vehicle connected to the battery. It is of disadvantage in this connection that the respective excitation taking place via the electrical consumers is not controlled and accordingly the desired frequency components are not generated in every case.

SUMMARY OF THE INVENTION

It is the underlying object of the invention to provide an improved system of the initially named kind with which the aforesaid disadvantages have been eliminated.

This object is satisfied in accordance with the invention in that means are provided for the monitoring of the state of at least some of the electrical elements as well as means to select the point in time for a respective voltage and current detection in dependence on the detected state of the electrical elements or to fix the conditions for a respective voltage and current detection or both.

In accordance with the invention, the so-called impedance spectroscopy is therefore combined with the simulation or modeling of the battery in order to determine battery states with high precision which in particular include the aging state (SoH) which makes high demands. The respective monitoring system can in particular be integrated in a vehicle, with it being able to deliver the respective information to the vehicle operator in site and in real time. The so-called impedance spectroscopy can therefore be integrated in a battery monitoring system provided in the respective vehicle, with it being supported by an electronic system monitoring or controlling suitable electrical elements or loads.

The electrical elements connected to the battery are preferably monitored as to whether they are effecting a pulse generating a desired frequency spectrum in the battery voltage or in the battery current, with the battery voltage and the battery current being detected on the occurrence of a corresponding pulse.

Advantageously, means can also be provided to generate a load pulse in dependence on the detected state of the electrical elements which brings about a desired frequency spectrum in the battery voltage or in the battery current, with in this case the battery voltage and the battery current being detected on the generation of a corresponding load pulse.

In accordance with a preferred embodiment of the system in accordance with the invention, the sampling rate on the detection of the battery voltage and of the battery current is selected in dependence on the properties of the occurring pulse or of the generated load pulse.

In certain cases, it is moreover of advantage for a normalization of the detected battery voltage or of the detected battery current to take place in dependence on the respective battery state.

At least one of the following states is advantageously monitored as the battery state: aging state (SoH), charge state (SoC), degree of function satisfaction (SoF).

At least the aging state SoH is preferably monitored as the battery state.

In accordance with an expedient practical embodiment, the battery voltage and the battery current are detected on the occurrence of a pulse generated by a starter/generator. This is in particular possible when the pulse generated by the starter/generator occurs as a reliably repeatable pulse having the high frequency content required for the spectral analysis.

Preferably only this pulse generated by the starter/generator is used as the trigger pulse for the detection of the battery voltage and of the battery current.

In specific cases, it can also be of advantage for the battery voltage and the battery current to be detected on the occurrence of a pulse generated by a starter/generator, supported by an additional excitation generated by a specific artificial, controllable load. This artificial controllable load is preferably a component of the battery sensor.

In this connection, the battery voltage and the battery current can be detected on the occurrence of the pulse generated by the starter/generator, advantageously supported by at least one additional artificial pulse generated by at least one already present electrical element, preferably an electrical consumer.

The artificial pulse is preferably generated via at least one electrical lamp and/or at least one electrical heating element. Additionally or alternatively, however, other electrical elements connected to the battery can also be used. In this connection, preferably at least two loads are activated in a specific time sequence.

Generally, the test underlying the monitoring system in accordance with the invention can therefore comprise the following steps, for example:

1. Determining the suitable time and/or condition for testing
2. Recognizing or generating a test pulse
3. Measuring the current and voltage values at a sampling rate appropriate for the pulse properties
4. Calculating the spectral impedance profile on the basis of the following relationship: $z(f):=u(f)/i(f)$, where $z(f)$ is the internal impedance of the battery at the frequency f, $u(f)$ is voltage at the frequency f and $i(f)$ is the current at the frequency f
5. Carrying out a normalization on the basis of the battery state (e.g. charge/discharge, temperature and/or the like)
6. Determining the characteristic properties
7. Preparing the aging state (SoH) index, for example.

Step 6 relating to the determination of the characteristic properties depends greatly on the properties of the battery such as in particular the rated capacity, the age and the previous history. The selection of the suitable processes, characteristics and limit values is expediently to be made during the calibration process. Generally, for example, such behavior methods as fuzzy logic or adaptive filters can be used for the derivation of the final value of the aging state (SoH) or both.

BRIEF DESCRIPTION OF THE DRAWINGS

The invention will be explained in more detail in the following with reference to embodiments and to the drawing; there are shown in it.

DESCRIPTION OF THE PREFERRED EMBODIMENT

Figure 1:
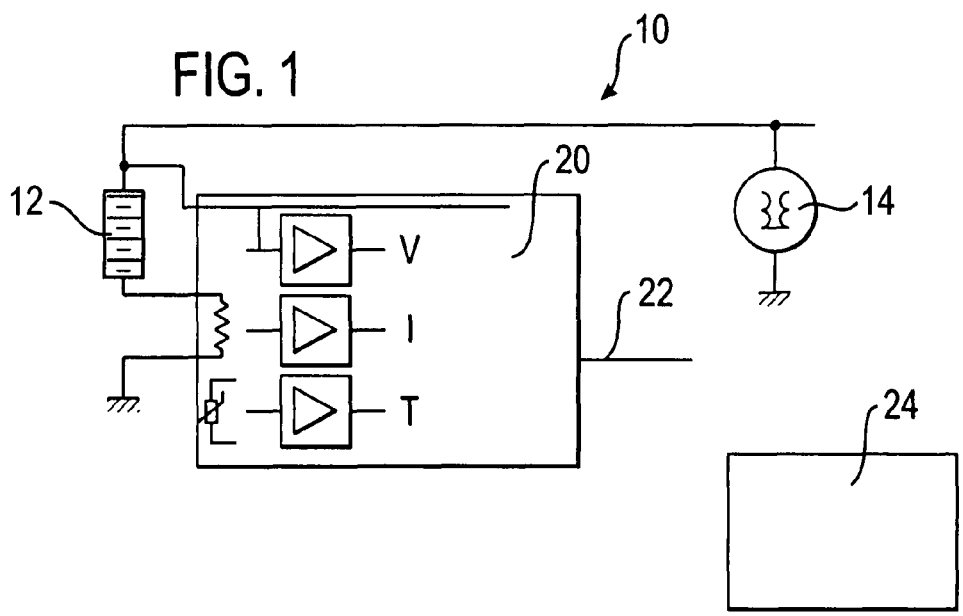
FIG. 1 is a schematic part representation of an exemplary embodiment of the monitoring system in which only the pulse generated by a starter/generator is used as the trigger pulse or as the excitation for the detection of the battery voltage and of the battery current.

FIG. 1 shows in a schematic part representation an exemplary embodiment of a system 10 for the monitoring of the state of a battery 12 used in a vehicle, in particular a motor vehicle, to which electrical elements comprising at least one electrical consumer and/or at least one electrical generator are connected which can be, for example, the starter/generator 14 or other electrical elements 16, 18 (cf. also FIG. 3) such as electrical lamps or electrical heating elements of the vehicle.

The monitoring system 10 in the present case comprises a battery sensor 20 for the detection of the battery voltage V, for the detection of the current I flowing out of or into the battery 12 and for the detection of the battery temperature T.

The sensor 20 is connected, for example via a serial bus 22, to an electronic control and/or evaluation unit 24 which can be integrated into the onboard system of the vehicle.

Voltage frequency components are, for example, extracted from the detected battery voltage V at different frequencies by means of the electronic control and/or evaluation unit 24 and current frequency components are extracted from the detected battery current I at the same frequencies at which the voltage frequency components are extracted. In addition, internal impedances of the battery 12 are determined or calculated, for example by means of the electronic control and/or evaluation unit 24, from the voltage frequency components and current frequency components extracted at a respective frequency.

In addition, predetermined relationships between the internal impedance and the battery state are stored for each of the respective frequencies, for example by means of the electronic control and/or evaluation unit 24.

Finally, this electronic control and/or evaluation unit 24 is configured such that it determines the battery state from the determined internal impedances and from the predetermined relationships.

In the present embodiment shown by way of example in FIG. 1, only the pulse generated by the starter/generator 14 of the vehicle is used as the trigger pulse or as the excitation for the detection of the battery voltage V and of the battery current I.

In such cases in which the pulse generated by the starter/generator 14 occurs as a reliably repeatable pulse which delivers the required high frequency content for the impedance spectral analysis, this pulse generated by the starter/generator 14 can be used, which brings about an extremely efficient and simple embodiment. The limits of this embodiment are, however, fixed by the fact that sufficient input data are not available in the time period lying between the starter pulses, which can be very long, to obtain reliable information, which is valid for the respective current point in time e.g. on the aging state (SoH).

Figure 2:
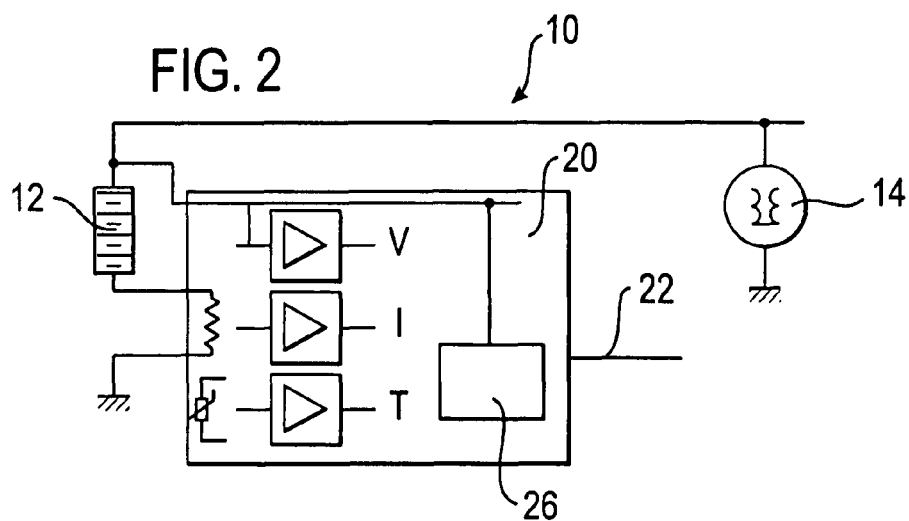
FIG. 2 is a schematic part representation of an exemplary embodiment of the monitoring system in which the battery voltage and the battery current are detected on the occurrence of the pulse generated by a starter/generator, supported by an additional excitation generated by a specific controllable load.

FIG. 2 shows in a schematic part representation an exemplary embodiment of the monitoring system 10 in which the battery voltage V and the battery current I are detected on the occurrence of the pulse generated by a starter/generator 14, supported by an additional excitation generated by a specific controllable load 26. This artificial controllable load 26 is preferably an integral component of the battery sensor 20. This is preferably an internal (onboard) artificial load which is controlled by the sensor 20 and which makes possible the generation, for example, of the test pulses explained in more detail further below.

This embodiment overcomes the previously named limits of the embodiment in accordance with FIG. 1 by the use of an additional excitation which is generated by one or more specific artificial controllable loads 26 which are monitored by the sensor 20 or by the electronic control and/or evaluation unit 24 connected to it, with the at least one additional artificial controllable load 26 preferably being integrated in the sensor 20.

The sensor 20 or the electronic control and/or evaluation unit 24 connected to it can generate a suitable pulse over the required spectrum or directly for frequencies which are particularly significant for the given type of the inspected battery 12 in dependence on its real time demands.

The sensor 20 or the electronic control and/or evaluation unit 24 connected to it can use the information on the state of the other loads in the vehicle systems to select the suitable point in time and the suitable conditions for the test in order, for example, to at least limit interference with existing excitations or to suppress possible side effects (visibility) for the user.

In another respect, the monitoring system 10 can at least substantially have the same structure as in the embodiment in accordance with FIG. 1. Parts corresponding to one another have had the same reference numerals associated with them. For reasons of simplicity, in the present case, however, the electronic control and/or evaluation unit also provided here is not shown.

Figure 3:
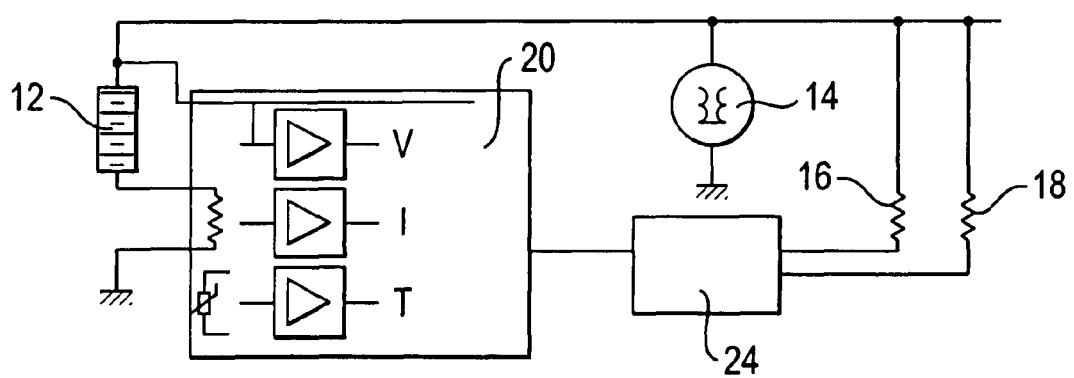
FIG. 3 is a schematic part representation of an exemplary embodiment of the monitoring system in which the battery voltage and the battery current are detected on the occurrence of the pulse generated by a starter/generator, supported by at least one additional artificial pulse generated via at least one already present electrical element, with the required test pulse being generated via two simple electrical consumers.

FIG. 3 shows in a schematic representation an embodiment of the monitoring system 10 in which the battery voltage V and the battery current I are detected on the occurrence of the pulse generated by the starter/generator 14, supported by at least one additional artificial pulse generated via at least one already present electrical element 16, 18. The already existing electrical elements 16, 18 can, for example, be electrical lamps or electrical heating elements. In that such already existing electrical elements 16, 18 are also used for the excitation of the test, additional artificial controllable loads can be dispensed with, whereby costs are saved and the effort is minimized.

Two simple electrical consumers are therefore required here to generate the required test pulse. The use of a two-stage load (e.g. "low beam" and "high beam" lamp or a two-stage heating) is conceivable, for example.

In this connection, a support of the respective test by the remaining electrical and/or electronic vehicle system is preferably provided in particular for the exchange of information and commands between the sensor 20 and other intelligent elements such as the onboard computer. In the representation in accordance with FIG. 3, a control and/or evaluation unit 24 internal to the vehicle and comprising a controller can be recognized, for example. The electrical or electronic devices named in another respect can also in particular be a part of this unit. This control and/or evaluation unit 24 can, where necessary, also include the respective electrical components in addition to the respective electronic components.

Since modern vehicle systems with the highly linked networks already have the possibility of exchanging the required quantity of commands and information, the impedance spectroscopy used here and the monitoring of the battery state can advantageously be integrated into the vehicle system. However, a corresponding configuration of the total system is required for this purpose. For this purpose, the battery state monitoring system would have to be realized at the level of the vehicle definition, for which purpose normally a full support by and cooperation with the original equipment manufacture is required.

In another respect, the present embodiment can again also at least substantially be configured like that of FIG. 1, with parts corresponding to one another again having the same reference numerals associated with them. The control and/or evaluation unit 24 is also not shown in the present case for reasons of simplicity.

Figure 4:
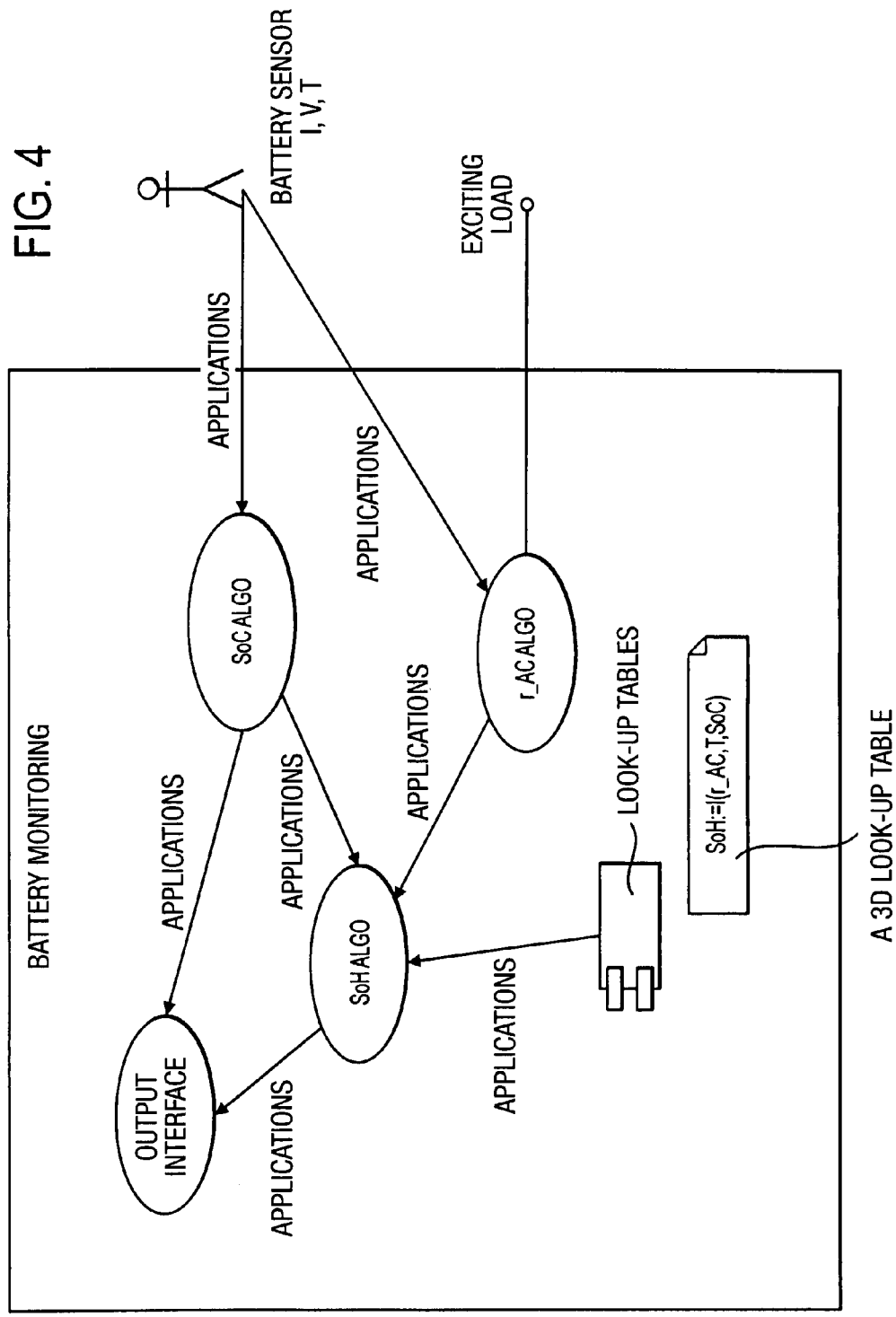
FIG. 4 is a simplified schematic representation of a battery monitoring for the generation of a final aging state value (SoH)

FIG. 4 shows, in a simplified schematic representation, an exemplary embodiment of a battery monitoring system for the generation of a final aging state value (SoH).

As can be seen from FIG. 4, the final aging state value (SoH) can be generated by a specific calculation function, with the current charge state (SoC), the battery temperature T and the impedance profile z(f) serving as input data. The generation of the aging state value (SoH) can take place by means of a customer-specific look-up table and/or in combination with such behavior processes such as were mentioned further above. The definition of the look-up table is part of the calibration process based on a specific algorithm.

Figure 5:
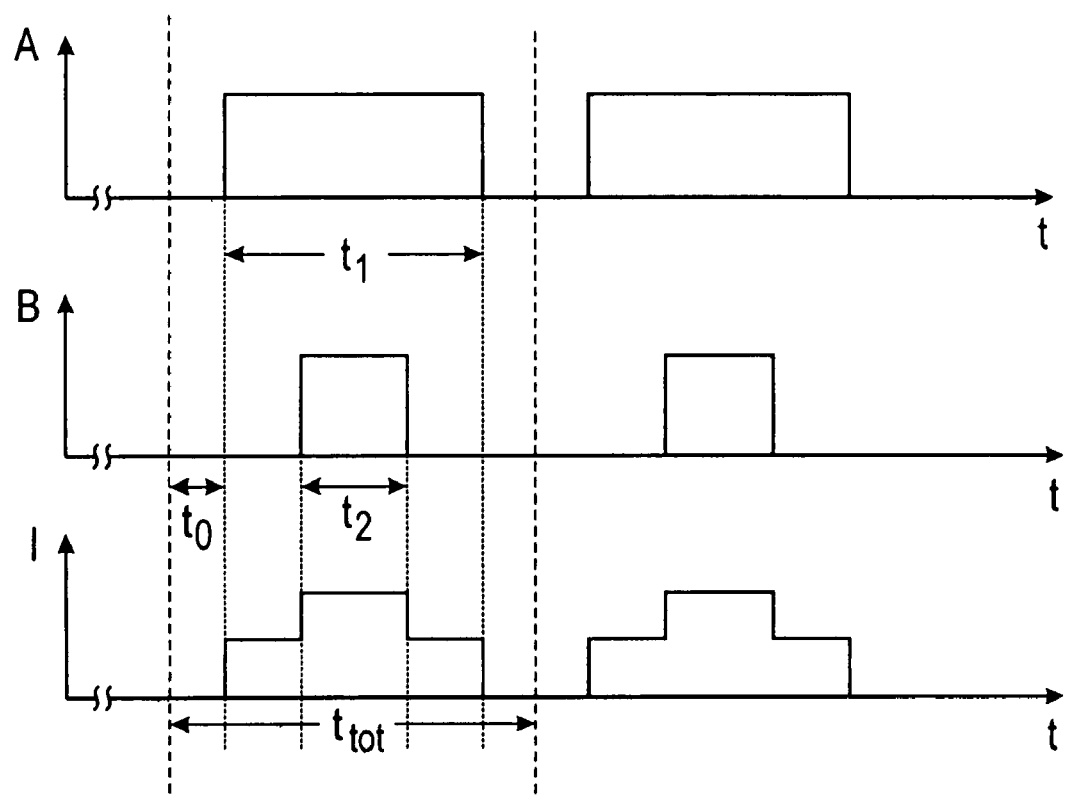
FIG. 5 is a diagram showing an example control of two electrical elements or loads for the generation of test pulses.

The diagram in accordance with FIG. 5 shows an exemplary control of two electrical elements or loads A, B for the generation of test pulses. In this connection, the time arrangement of the activation of the loads A and B are selected such that the resulting current I follows the shown development over the time t.

As results from the diagram, initially neither the load A nor the load B is activated at the start of a presettable time interval $t_{tot}$. After the time $t_0$, the load A is then first activated. This load A remains activated during the time $t_1$. The load B is then also activated within this time interval $t_1$. This load B remains activated during the time $t_2$ which is smaller than $t_1$.

In this connection, the control of the loads A and B can be determined, for example, by the following relationships:

$$t_2 = 0.36 \times t_{tot}$$

$$t_1 = 0.64 \times t_{tot}$$

$$t_0 = 0.18 \times t_{tot}.$$

As can be recognized with reference to the diagram, the time interval $t_2$ of the activation of the load B can lie, for example, centered within the time interval $t_1$ of the activation of the load A. A symmetrical development of the current I accordingly results with a higher value in the middle range.

The arrangement provided in the present embodiment represents an optimization of the approximation of the control to a sinusoidal control. The shape defined by the times $t_0$, $t_1$ und $t_2$ brings about the least harmonic components so that unwanted interference (EMV) is reduced to a minimum and relatively simple rectangular developments are maintained.

The loads can, for example, be artificial or normal loads, with generally electrical consumers and/or generators being conceivable.

The invention claimed is:

1. A system for monitoring a state of a battery used in a vehicle, said system comprising:
   an electrical generator of said vehicle being connected to said battery;
   an electrical element preexisting in said vehicle for normal use being actuable to generate a pulse load and being connected to said battery;
   means for the detection of the battery voltage;
   means for the extraction of voltage frequency components from the detected battery voltage at different frequencies;
   means for the detection of the current flowing out of or into the battery;

means for the extraction of current frequency components from the detected battery current at the same frequencies at which the voltage frequency components were extracted;

means for the determination of internal impedances of the battery from the voltage frequency components and current frequency components extracted at a respective frequency;

means for the storage of predetermined relationships between the internal impedance and the battery state for each of the respective frequencies;

means for the determination of the battery state from the determined internal impedances and the predetermined relationships;

means for monitoring the state of the electrical generator in order to select the time for a respective voltage and current detection in dependence on the detected state of the electrical generator;

said generator generating a trigger pulse and battery voltage and battery current being detected on the occurrence of said trigger pulse; and a controller for controlling said electrical element in addition to its normal use to activate said electrical element to add to the trigger pulse after said trigger pulse commences to effect a load pulse generating a desired frequency spectrum in the battery voltage or in the battery current and the battery voltage and battery current being detected on the occurrence of said trigger pulse and load pulse.

2. A system in accordance with claim 1, characterized in that a sampling rate on the detection of the battery voltage and of the battery current is selected in dependence on the properties of the generated load pulse.

3. A system in accordance with claim 2, characterized in that a normalization of the detected battery voltage or of the detected battery current takes place in dependence on the respective battery state.

4. A system in accordance with claim 3, characterized in that at least one of the following states is monitored as the battery state: aging state (SoH), charge state (SoC), degree of function satisfaction (SoF).

5. A system in accordance with claim 4, characterized in that at least the aging state (SoH) is monitored as the battery state.

6. A system according to claim 1 further comprising:
said electrical element being at least one electrical lamp controlled by said controller for generating said load pulse.

7. A system according to claim 1 further comprising:
said electrical element being at least one electrical heating element controlled by said controller for generating said load pulse.

* * * * *